(12) United States Patent
Jang

(10) Patent No.: US 8,023,608 B2
(45) Date of Patent: Sep. 20, 2011

(54) COMMUNICATION SYSTEM USING MULTI-PHASE CLOCK SIGNALS

(75) Inventor: Young-Chan Jang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 694 days.

(21) Appl. No.: 12/121,017

(22) Filed: May 15, 2008

(65) Prior Publication Data

US 2008/0285699 A1    Nov. 20, 2008

(30) Foreign Application Priority Data

May 17, 2007   (KR) ........................ 10-2007-0048254

(51) Int. Cl.
    *H03D 3/24*    (2006.01)
(52) U.S. Cl. ........................................ 375/376; 327/158
(58) Field of Classification Search .................. 327/141, 327/158, 161, 407; 331/11; 375/376
    See application file for complete search history.

(56) References Cited

U.S. PATENT DOCUMENTS

| | | | |
|---|---|---|---|
| 6,414,528 B1 * | 7/2002 | Usui | 327/158 |
| 6,909,312 B2 * | 6/2005 | Mitsumoto | 327/141 |
| 7,102,446 B1 * | 9/2006 | Lee et al. | 331/11 |
| 7,482,848 B2 * | 1/2009 | Lee | 327/158 |
| 2004/0066873 A1 * | 4/2004 | Cho et al. | 375/376 |
| 2004/0103333 A1 * | 5/2004 | Martwick et al. | 713/400 |

FOREIGN PATENT DOCUMENTS

| | | |
|---|---|---|
| KR | 2003-0056462 | 7/2003 |
| KR | 2005-0041730 | 5/2005 |
| KR | 2006-0079581 | 7/2006 |

\* cited by examiner

*Primary Examiner* — David C. Payne
*Assistant Examiner* — Leon-Viet Nguyen
(74) *Attorney, Agent, or Firm* — Harness, Dickey & Pierce

(57) ABSTRACT

A communication system using multi-phase clock signals. The communication system includes a transmitter and a receiver. The transmitter outputs first data and a clock signal based on first multi-phase clock signals, and performs a coarse lock operation on the clock signal in response to a bit lock detection signal indicating whether or not the first data are bit-locked. The receiver receives the first data and the clock signal from the transmitter, generates second multi-phase clock signals based on the clock signal, generates second data by sampling the first data based on the second multi-phase clock signals, and performs a fine lock operation on the second multi-phase clock signals in response to the bit lock detection signal. Therefore, a jitter noise may be reduced and a size of a multi-phase clock generator included in the receiver may be reduced.

17 Claims, 13 Drawing Sheets

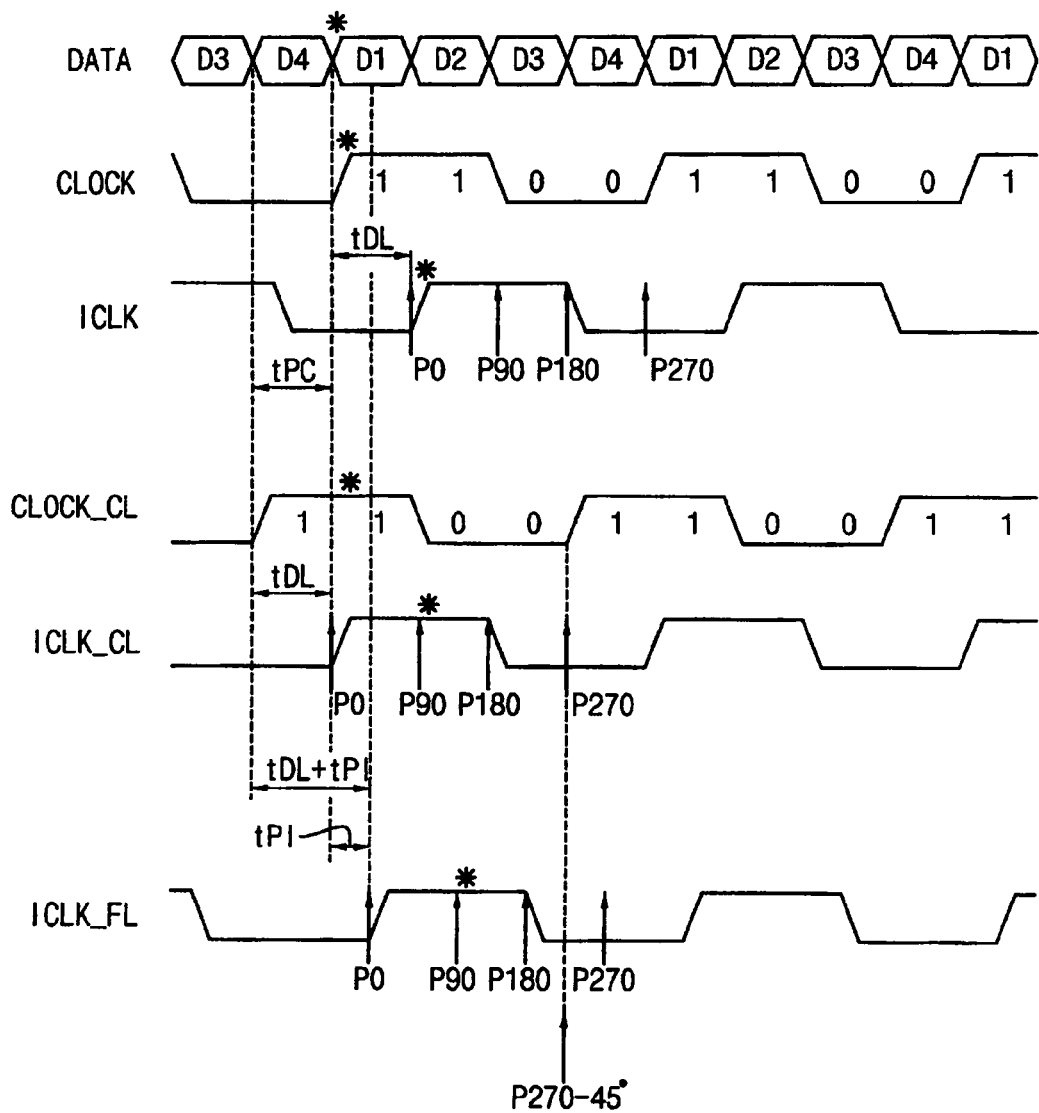

COMMUNICATION SYSTEM USING MULTI-PHASE CLOCK SIGNALS

CROSS-REFERENCE TO RELATED APPLICATIONS

This application claims priority under 35 USC §119 to Korean Patent Application No. 2007-48254, filed on May 17, 2007 in the Korean Intellectual Property Office (KIPO), the disclosure of which is incorporated herein in its entirety by reference.

BACKGROUND OF THE INVENTION

1. Field of the Invention

The present invention relates to a communication system, and more particularly, to a communication system using multi-phase clock signals.

2. Description of the Related Art

A communication system includes a transmitter and a receiver. The transmitter samples data with a clock signal having a fixed period, and transmits the sampled data. The receiver receives the clock signal as well as the data from the transmitter.

As information technology has been developed, integration density and operation speed of a semiconductor memory device have increased. A single data rate dynamic random access memory (SDR DRAM) outputs data of one bit during one clock cycle, and a double data rate dynamic random access memory (DDR DRAM) outputs data of two bits during one clock cycle. A quad data rate dynamic random access memory (QDR DRAM) outputs data of four bits during one clock cycle, and an octal data rate dynamic random access memory (ODR DRAM) outputs data of eight bits during one clock cycle. The QDR DRAM and ODR DRAM sample data with a multi-phase clock signal.

In a memory system using multi-phase clock signals, it is difficult to control skew between a clock signal and data. For example, in a conventional QDR DRAM using a differential clock signal, when the skew between the clock signal and the data is caused by a difference between a path of the data and a path of the clock signal, a jitter noise of up to 6 unit intervals (UI) may occur if a phase-lock operation is performed only in a receiver. In a conventional ODR DRAM, when the skew between the clock signal and the data occurs, a jitter noise of up to 12 UI may occur if the phase-lock operation is performed only in the receiver. Furthermore, in the memory system using the multi-phase clock signals, if the phase-lock operation is performed only in a clock generator of the receiver to lock phases of the data and the clock signal, the clock signal should be delayed by a long delay time through phase interpolation, thereby increasing a size of the clock generator of the receiver and increasing a noise in the receiver.

FIG. 1 is a timing diagram illustrating a process of synchronizing data with multi-phase clock signals in a conventional communication system. Referring to FIG. 1, a transmitter synchronizes data DATA and a clock signal CLOCK with each other, and transfers the synchronized data and clock signal. A sampling clock signal CK_SP is generated by delaying the clock signal CLOCK by a first delay time tDL by a delay line of a clock generator included in a receiver. A phase-interpolated sampling clock signal CK_SP_PI is generated by interpolating a phase of the sampling clock signal CK_SP, and thus the phase-interpolated sampling clock signal CK_SP_PI is delayed by a second delay time tPI with respect to the sampling clock signal CK_SP. In FIG. 1, P0 represents a rising edge of a clock signal having a phase of 0 degrees among multi-phase clock signals, P90 represents a rising edge of a clock signal having a phase of 90 degrees among the multi-phase clock signals, P180 represents a rising edge of a clock signal having a phase of 180 degrees among the multi-phase clock signals, and P270 represents a rising edge of a clock signal having a phase of 270 degrees among the multi-phase clock signals. In FIG. 1, an asterisk (*) represents a noise position of data or a clock signal. A noise of the data DATA outputted from the transmitter and a noise of the clock signal CLOCK outputted from the transmitter occur simultaneously. However, a noise of the sampling clock signal CK_SP generated in the receiver occurs when the first delay time tDL elapses after the noise of the data DATA occurs. A noise of the phase-interpolated sampling clock signal CK_SP_PI occurs when a third delay time, which is the sum of the first delay time tDL and the second delay time tPI, elapses after the noise of the data DATA occurs. The sampling clock signal CK_SP must be delayed by at least 2 Unit Intervals (UI) by phase interpolation so that the rising edge P0 of the phase-interpolated sampling clock signal CK_SP_PI corresponds in time to a bit D1 of the data DATA.

If data are synchronized with multi-phase clock signals in a manner illustrated in FIG. 1, a large jitter noise occurs and a clock generator requires a long delay time for the described synchronization. Furthermore, a complex circuit, such as a register, is needed for phase interpolation, and a chip size of a semiconductor integrated circuit increases.

SUMMARY OF THE INVENTION

Accordingly, the present invention is provided to substantially obviate one or more problems due to limitations and disadvantages of the related art.

Some example embodiments of the present invention provide a communication system including a transmitter performing a coarse lock operation on a clock signal used in a receiver and the receiver performing a fine lock operation on the clock signal.

Some example embodiments of the present invention provide a communication method of performing a coarse lock operation in a transmitter and performing a fine lock operation in a receiver.

In some example embodiments of the present invention, a communication system includes a transmitter and a receiver.

The transmitter may output first data and a clock signal based on first multi-phase clock signals, and may perform a coarse lock operation on the clock signal in response to a bit lock detection signal indicating whether or not the first data are bit-locked. The receiver may receive the first data and the clock signal from the transmitter, generate second multi-phase clock signals based on the clock signal, generate second data by sampling the first data based on the second multi-phase clock signals, and perform a fine lock operation on the second multi-phase clock signals in response to the bit lock detection signal.

Therefore, in the communication system according to some example embodiments, a jitter noise may be reduced and a delay time to be generated in a phase interpolator may be shorter than a delay time required by a conventional communication system. Furthermore, a chip size of a receiver may be reduced when the receiver is implemented with a semiconductor integrated circuit.

BRIEF DESCRIPTION OF THE DRAWINGS

FIG. 8 is a timing diagram illustrating a process of synchronizing multi-phase clock signals with data in the communication system of FIG. 2.

FIG. 9 is a table illustrating a coarse lock operation performed by a transmitter included in the communication system of FIG. 2.

DESCRIPTION OF THE EMBODIMENTS

Figure 1:
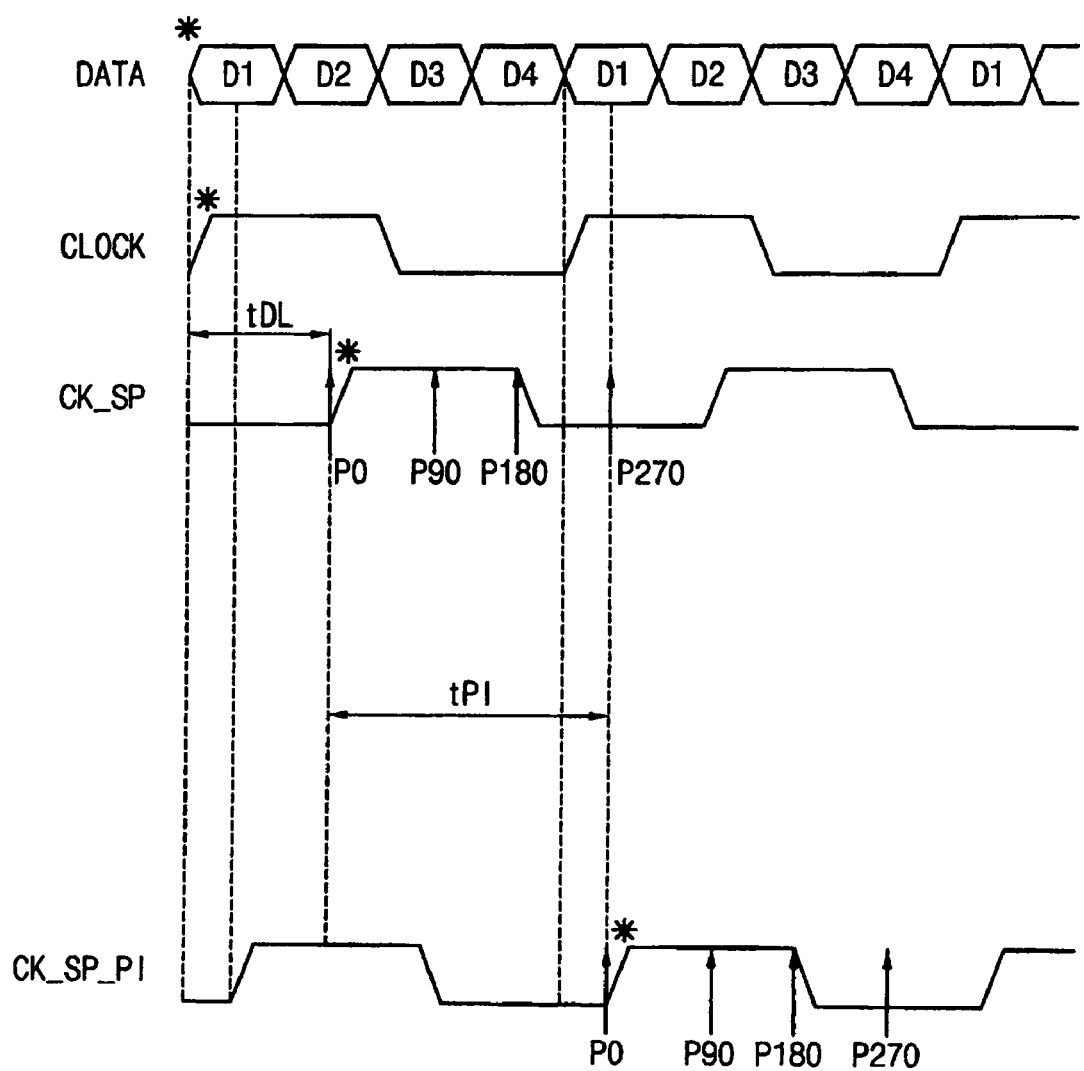
FIG. 1 is a timing diagram illustrating a process of synchronizing data with multi-phase clock signals in a conventional communication system.

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
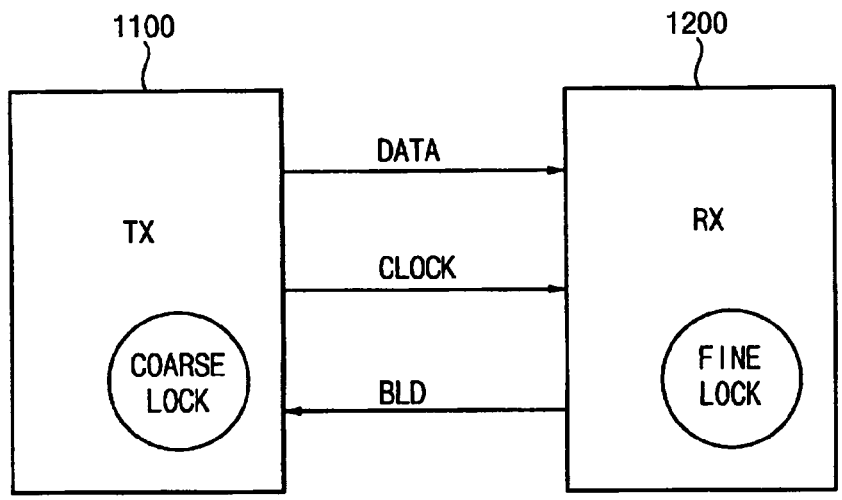
FIG. 2 is a block diagram illustrating a communication system according to an example embodiment of the present invention.

FIG. 2 is a block diagram illustrating a communication system according to an example embodiment of the present invention. Referring to FIG. 2, the communication system 1000 includes a transmitter 1100 and a receiver 1200. In the communication system 1000 of FIG. 2, the transmitter 1100 performs a coarse lock operation on a clock signal, and the receiver 1200 performs a fine lock operation on the clock signal received from the transmitter 1100.

The transmitter 1100 generates first data DATA having a plurality of bits and first multi-phase clock signals. The transmitter 1100 outputs the first data DATA using the first multi-phase clock signals, generates a clock signal CLOCK of which a phase changes in response to a bit lock detection signal BLD, and outputs the clock signal CLOCK in response to the first multi-phase clock signals.

The receiver 1200 performs the fine lock operation on the clock signal CLOCK in response to the bit lock detection signal BLD, and generates second multi-phase clock signals. The receiver 1200 also generates second data having a plurality of bits by sampling the first data DATA using the second multi-phase clock signals.

In the communication system 1000 illustrated in FIG. 2, the coarse lock operation is performed in the transmitter 1100 and the fine lock operation is performed in the receiver 1200 so that the clock signal CLOCK and the first data DATA are synchronized. Thus, in the receiver 1200 included in the communication system 1000, a jitter noise may be reduced and a delay time to be generated by a phase interpolator may be reduced as compared with conventional communication systems. Therefore, a multi-phase clock generator included in the receiver 1200 may be implemented with a relatively small circuit size, and a chip size of the receiver 1200 may be reduced. In some embodiments, each of the transmitter 1100 and the receiver 1200 may be formed as one semiconductor integrated circuit. In other embodiments, the transmitter 1100 may be included in a memory controller, the receiver 1200 may be included in a memory device, and the second data may be write data provided to a memory cell array in the memory device. For example, the memory controller may be implemented as a chip, the memory device may be implemented as another chip, and the communication system 1000 may be used for chip-to-chip interface.

Figure 3:
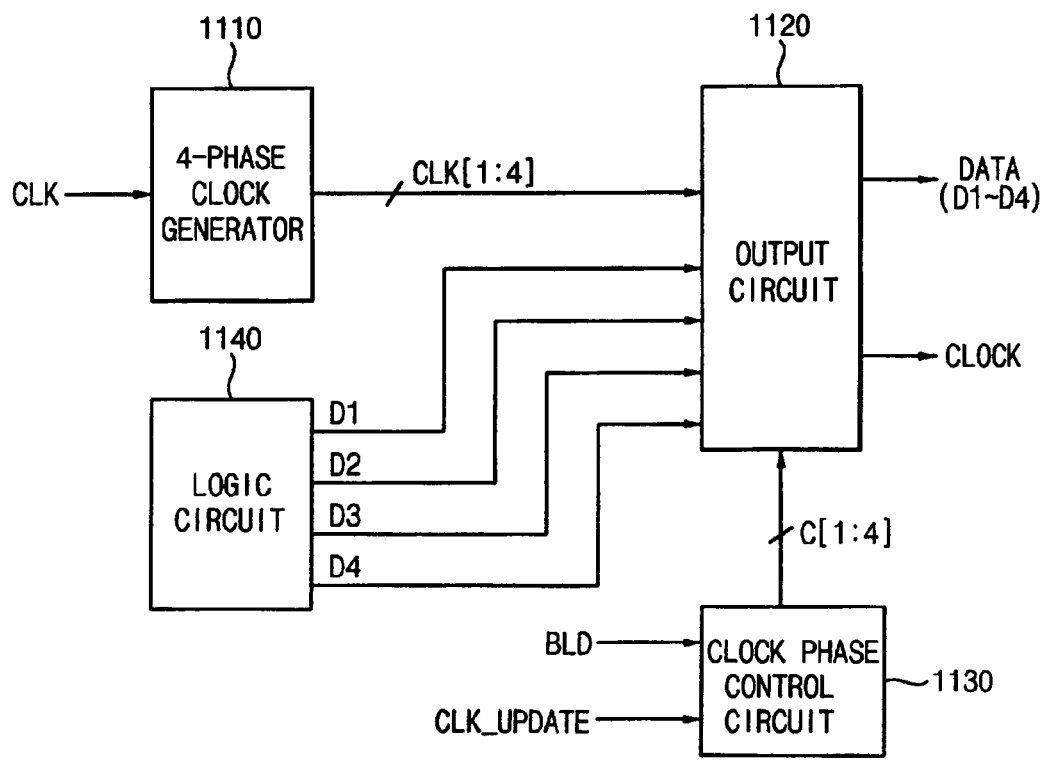
FIG. 3 is a block diagram illustrating an example of a transmitter included in the communication system of FIG. 2.

FIG. 3 is a block diagram illustrating an example of a transmitter included in the communication system of FIG. 2. Referring to FIG. 3, the transmitter 1100 includes a multi-phase clock generator 1110, a clock phase control circuit 1130, a logic circuit 1140 and an output circuit 1120.

The multi-phase clock generator 1110 may generate first multi-phase clock signals CLK[1:4], for example 4-phase clock signals, based on an external clock signal CLK. The clock phase control circuit 1130 may generate a clock phase control signal C[1:4] of 4 bits in response to a bit lock detection signal BLD and a clock update signal CLK_UPDATE. The logic circuit 1140 may generate first data DATA of 4 bits D1, D2, D3 and D4. The output circuit 1120 may output the first data DATA in response to the first multi-phase clock signals CLK[1:4], and may output a clock signal CLOCK based on the clock phase control signal C[1:4] and the first multi-phase clock signals CLK[1:4].

Figure 4:
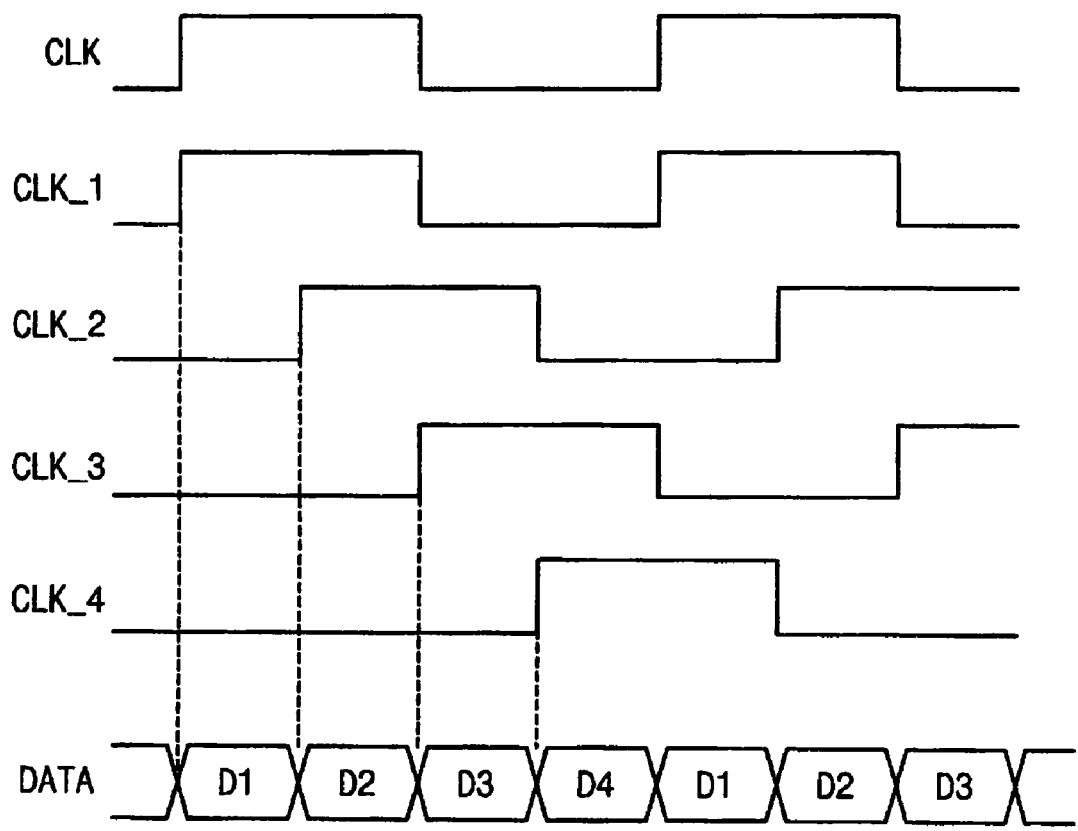
FIG. 4 is a timing diagram illustrating multi-phase clock signals and data in the transmitter of FIG. 3.

FIG. 4 is a timing diagram illustrating multi-phase clock signals and data associated with the transmitter of FIG. 3. In FIG. 4, CLK_1 represents a first phase clock signal having a phase that is the same as a phase of the external clock signal CLK; CLK_2 represents a second phase clock signal having a phase that is delayed by 90 degrees with respect to the phase of the external clock signal CLK; CLK_3 represents a third phase clock signal having a phase that is delayed by 180 degrees with respect to the phase of the external clock signal CLK; and CLK_4 represents a fourth phase clock signal having a phase that is delayed by 270 degrees with respect to the phase of the external clock signal CLK.

Referring to FIG. 4, a first bit D1 of the data DATA may be output in response to a rising edge of the first phase clock signal CLK_1; a second bit D2 of the data DATA may be output in response to a rising edge of the second phase clock signal CLK_2; a third bit D3 of the data DATA may be output in response to a rising edge of the third phase clock signal CLK_3; and a fourth bit D4 of the data DATA may be output in response to a rising edge of the fourth phase clock signal CLK_4.

Figure 5:
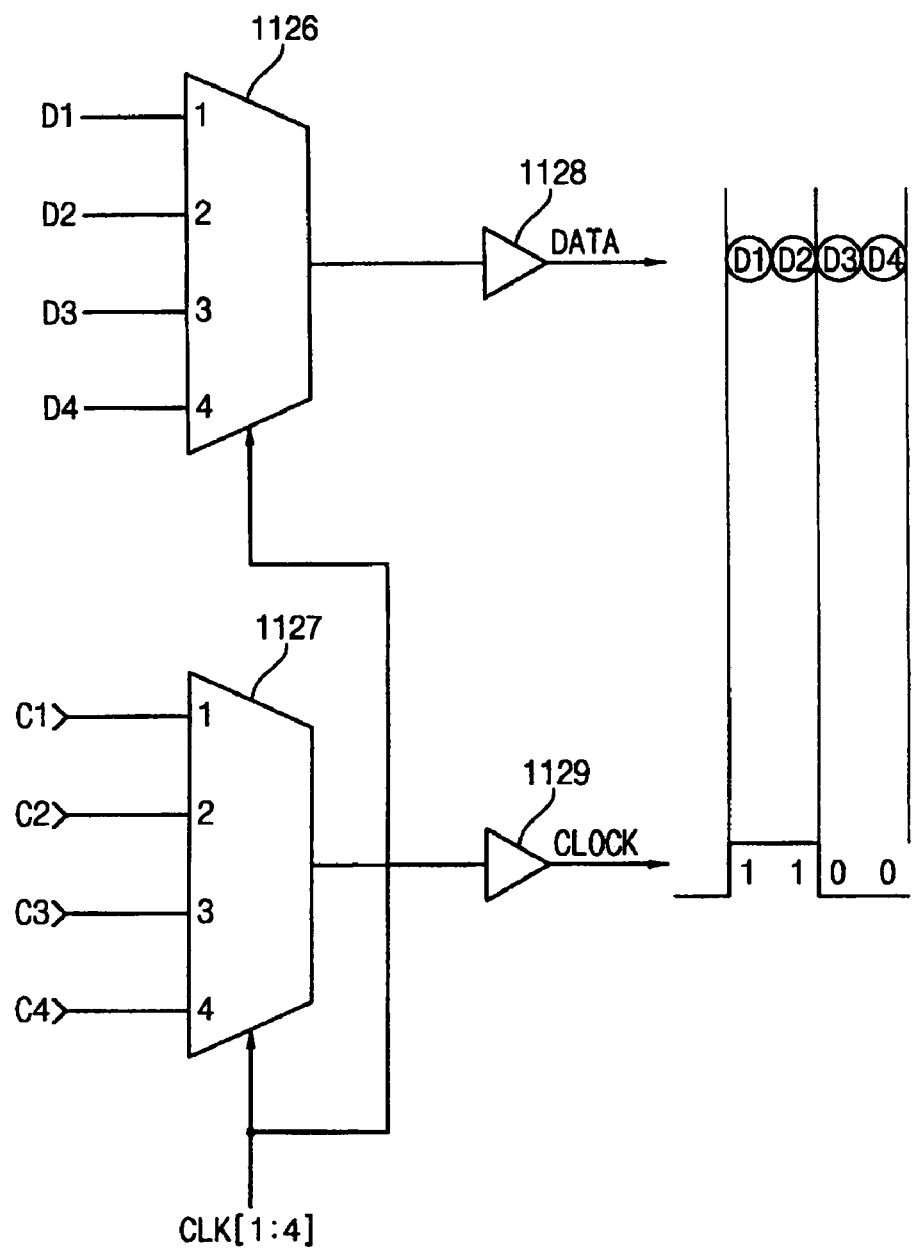
FIG. 5 is a circuit diagram illustrating an example of an output circuit included in the transmitter of FIG. 3.

FIG. 5 is a circuit diagram illustrating an example of an output circuit included in the transmitter of FIG. 3. Referring to FIG. 5, the output circuit 1120 includes a first multiplexer 1126 and a second multiplexer 1127.

The first multiplexer 1126 selectively outputs each bit D1, D2, D3 and D4 of the first data DATA in response to the first multi-phase clock signals CLK[1:4]. That is, the bits D1, D2, D3 and D4 of the first data DATA are sequentially output from the first multiplexer 1126 in response to the first multi-phase clock signals CLK[1:4]. The second multiplexer 1127 generates the clock signal CLOCK by selectively outputting each bit C1, C2, C3 and C4 of the clock phase control signal C[1:4] in response to the first multi-phase clock signals CLK[1:4]. That is, the bits C1, C2, C3 and C4 of the clock phase control signal C[1:4] are sequentially output from the second multiplexer 1127 in response to the first multi-phase clock signals CLK[1:4], and thus the clock signal CLOCK may be determined by the combination of the outputted sequential bits (e.g., "1100"). The clock phase control signal C[1:4] may consist of digital codes.

The output circuit 1120 may further include a first buffer 1128 and a second buffer 1129. The first buffer 1128 may output the first data DATA by buffering an output signal of the first multiplexer 1126, and the second buffer 1129 may output the clock signal CLOCK by buffering an output signal of the second multiplexer 1127.

Figure 6:
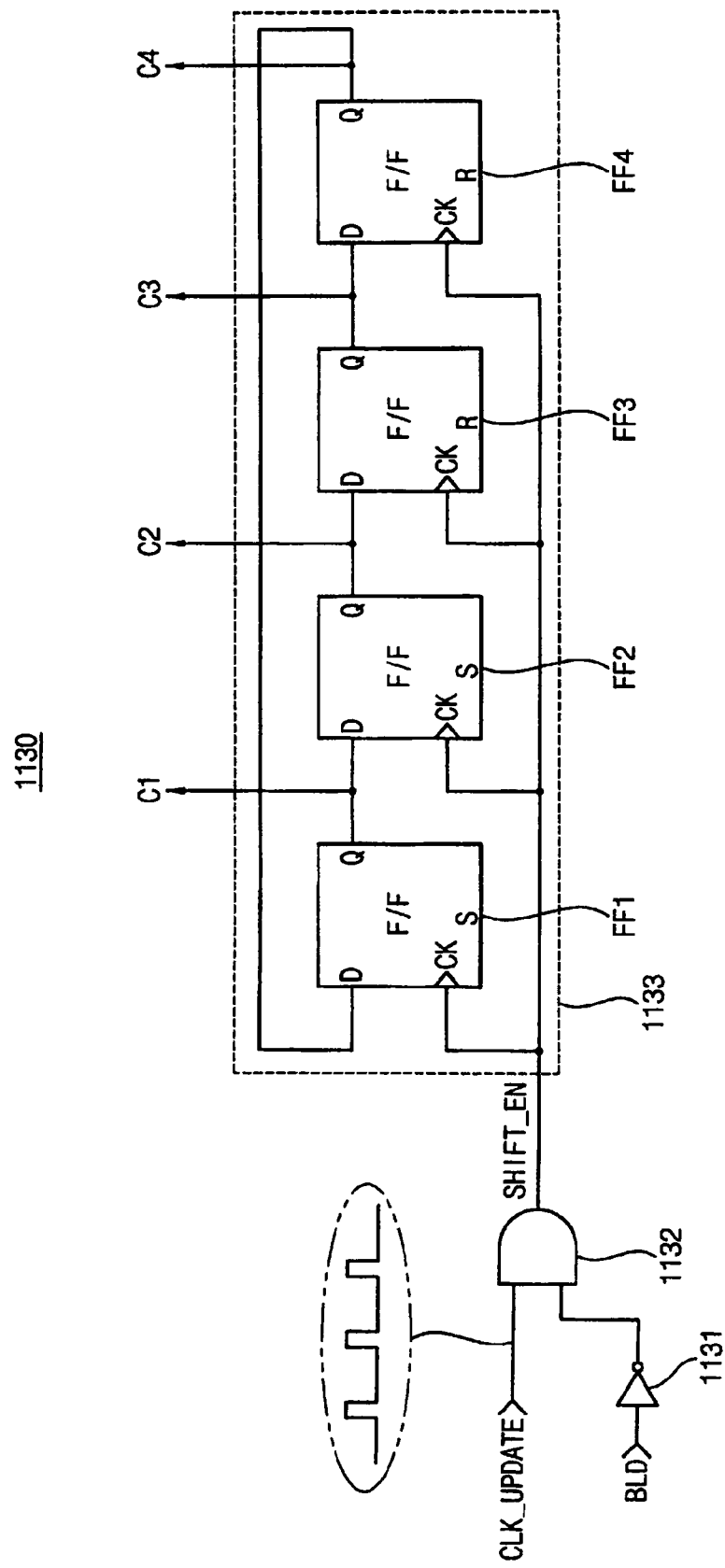
FIG. 6 is a circuit diagram illustrating an example of a clock phase control circuit included in the transmitter of FIG. 3.

FIG. 6 is a circuit diagram illustrating an example of a clock phase control circuit included in the transmitter of FIG. 3. Referring to FIG. 6, the clock phase control circuit 1130 includes an inverter 1131, an AND gate 1132, and a shift register 1133.

The inverter 1131 is configured to invert the bit lock detection signal BLD. The AND gate 1132 performs an AND operation on an output signal of the inverter 1131 and the clock update signal CLK_UPDATE, and generates a shift enable signal SHIFT_EN having one or more pulses. The shift register 1133 performs a shift operation in response to the shift enable signal SHIFT_EN, and outputs bits C1, C2, C3 and C4 of the clock phase control signal C[1:4]. The shift register 1133 includes cascade-connected flip-flops FF1, FF2, FF3, and FF4. A first bit C1 of the clock phase control signal C[1:4] is output from an output terminal of a first flip-flop FF1, a second bit C2 of the clock phase control signal C[1:4] is output from an output terminal of a second flip-flop FF2, a third bit C3 of the clock phase control signal C[1:4] is output from an output terminal of a third flip-flop FF3, and a fourth bit C4 of the clock phase control signal C[1:4] is output from an output terminal of a fourth flip-flop FF4. When the clock phase control circuit 1100 initially operates, the first flip-flop FF1 and the second flip-flop FF2 may be set, and the third flip-flop FF3 and the fourth flip-flop FF4 may be reset. Thus, when the clock phase control circuit 1100 initially operates, the clock phase control signal C[1:4] may be "1100."

When the bit lock detection signal BLD is in a logic "low" state, or when the clock signal CLOCK is still not bit-locked, the shift enable signal SHIFT_EN of a pulse type may be activated. The shift register 1133 may output the clock phase control signal C[1:4] of 4 bits C1, C2, C3 and C4 that are shifted in response to the shift enable signal SHIFT_EN.

When the bit lock detection signal BLD is in a logic "high" state, or when the clock signal CLOCK is bit-locked, the shift enable signal SHIFT_EN may be disabled. Then, the shift register 1133 does not perform the shift operation.

Figure 7:
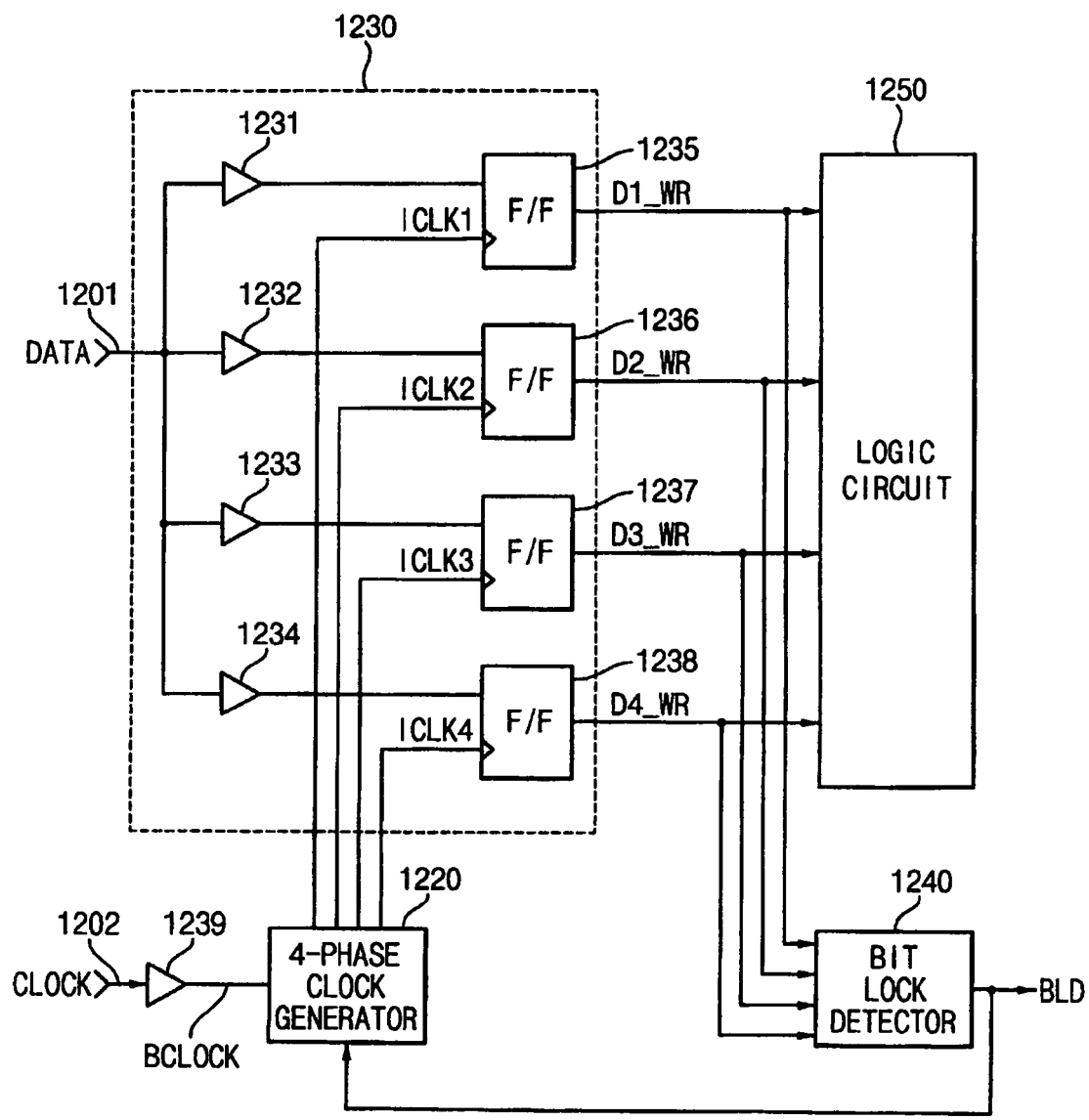
FIG. 7 is a block diagram illustrating an example of a receiver included in the communication system of FIG. 2.

FIG. 7 is a block diagram illustrating an example of a receiver included in the communication system of FIG. 2. Referring to FIG. 7, the receiver 1200 includes a first buffer 1239, a multi-phase clock generator 1220, an input circuit 1230, a bit lock detector 1240, and a logic circuit 1250. The multi-phase clock generator 1220 may include a delay line (not shown) and a phase interpolator (not shown).

The receiver 1200 receives the first data DATA through a data input terminal 1201 and receives the clock signal CLOCK through a clock input terminal 1202. The multi-phase clock generator 1220 performs phase interpolation based on the bit lock detection signal BLD and an output signal BCLOCK of the first buffer 1239 to generate second multi-phase clock signals ICLK1, ICLK2, ICLK3 and ICLK4.

The input circuit 1230 generates second data by sampling the first data DATA in response to the second multi-phase clock signals ICLK1, ICLK2, ICLK3 and ICLK4. The bit lock detector 1240 detects whether the first data DATA are bit-locked in response to the second data, and generates the bit lock detection signal BLD. The bit lock detector 1240 may generate the bit lock detection signal BLD by using at least one of bits D1_WR, D2_WR, D3_WR and D4_WR of the second data, or may alternatively generate the bit lock detection signal BLD by using all bits D1_WR, D2_WR, D3_WR and D4_WR of the second data. The logic circuit 1250 may operate in response to the bits D1_WR, D2_WR, D3_WR and D4_WR of the second data.

The input circuit 1230 includes a second buffer 1231, a third buffer 1232, a fourth buffer 1233, a fifth buffer 1234, a first flip-flop 1235, a second flip-flop 1236, a third flip-flop 1237 and a fourth flip-flop 1238.

The second buffer 1231, the third buffer 1232, the fourth buffer 1233 and the fifth buffer 1234 may be configured to buffer the first data DATA. The first flip-flop 1235 outputs a first bit D1_WR by sampling an output signal of the second buffer 1231 in response to a first phase clock signal ICLK1 of the second multi-phase clock signals. The second flip-flop 1236 outputs a second bit D2_WR by sampling an output signal of the third buffer 1232 in response to a second phase clock signal ICLK2 of the second multi-phase clock signals. The third flip-flop 1237 outputs a third bit D3_WR by sampling an output signal of the fourth buffer 1233 in response to a third phase clock signal ICLK3 of the second multi-phase clock signals. The fourth flip-flop 1238 outputs a fourth bit D4_WR by sampling an output signal of the fifth buffer 1234 in response to a fourth phase clock signal ICLK4 of the second multi-phase clock signals.

The bit lock detector 1240 detects whether the first data DATA are bit-locked in response to the bits D1_WR, D2_WR, D3_WR and D4_WR of the second data. For example, if a time difference between the center of the first bit D1_WR of the second data and the first phase clock signal ICLK1 of the second multi-phase clock signals generated by the multi-phase clock generator 1220 is shorter than 1 UI, the bit lock detector 1240 may determine that the first data DATA are bit-locked, and may activate the bit lock detection signal BLD. If the bit lock detection signal BLD is activated, the multi-phase clock generator 1220 performs the fine lock operation on the clock signal CLOCK through the phase interpolation in response to the bit lock detection signal BLD.

FIG. 8 is a timing diagram illustrating a process of synchronizing multi-phase clock signals with data in the communication system of FIG. 2. In FIG. 8, DATA represents the first data outputted from the transmitter 1100, CLOCK represents the clock signal outputted from the transmitter 1100, and ICLK represents an internal clock signal having multiple phases generated in the receiver 1200 based on the clock signal CLOCK. That is, the internal clock signal is the second multi-phase clock signals generated by the receiver 1200. CLOCK_CL represents a coarse-locked clock signal that is the clock signal CLOCK on which the coarse lock operation is performed in the transmitter 1100, and ICLK_CL represents a coarse-locked internal clock signal that is a clock signal delayed with respect to the clock signal CLOCK_CL by a delay line included in the receiver 1200. ICLK_FL represents a fine-locked internal clock signal that is the coarse-locked clock signal CLOCK_CL on which the fine lock operation is performed. An asterisk (*) represents a noise position of data or a clock signal.

Referring to FIG. 8, the transmitter 1100 illustrated in FIG. 2 synchronizes and transmits the first data DATA and the clock signal CLOCK. The internal clock signal ICLK is delayed by a first delay time tDL with respect to the clock signal CLOCK by the delay line of the multi-phase clock generator included in the receiver 1200. The multi-phase clock generator may include a phase-locked loop circuit or a delay-locked loop circuit. In FIG. 8, P0 represents a rising edge of a clock signal having a phase of 0 degrees among multi-phase clock signals; P90 represents a rising edge of a clock signal having a phase of 90 degrees among the multi-phase clock signals; P180 represents a rising edge of a clock signal having a phase of 180 degrees among the multi-phase clock signals; and P270 represents a rising edge of a clock signal having a phase of 270 degrees among the multi-phase clock signals. A noise of the first data DATA outputted from the transmitter 1100 and a noise of the clock signal CLOCK outputted from the transmitter 1100 may occur simultaneously. A noise of the internal clock signal ICLK generated in the receiver 1200, however, may occur when the first delay time tDL elapses after the noise of the first data DATA occurs.

The coarse-locked clock signal CLOCK_CL that is generated after the coarse lock operation is performed in the transmitter 1100 may lead the clock signal CLOCK by a phase control time tPC. A noise of the coarse-locked clock signal CLOCK_CL and the noise of the first data DATA may occur at substantially the same time. A noise of the coarse-locked internal clock signal ICLK_CL delayed with respect to the coarse-locked clock signal CLOCK_CL by the delay line included in the receiver 1200 may occur when the first delay time tDL elapses after the noise of the first data DATA occurs.

The fine-locked internal clock signal ICLK_FL, which represents a clock signal that is fine-locked with respect to the coarse-locked clock signal CLOCK_CL, is synchronized with the first data DATA. Thus, a rising edge of a first phase clock P0 of the fine-locked internal clock signal ICLK_FL may correspond in time to the center of the first bit D1 of the first data DATA. In the timing diagram of FIG. 8, a delay time caused by phase interpolation during the fine lock operation may be about 0.5 UI. Here, 1 UI represents one unit interval of data bits. In the example of FIG. 8, a time difference between when the noise of the first data DATA occurs and when a noise of the fine-locked internal clock signal ICLK_FL occurs is shorter than 2 UI.

As illustrated in FIG. 8, since a delay time caused by phase interpolation is relatively short in a receiver included in a communication system according to some example embodiments of the present invention, the size of a shift register included in a phase interpolator may be relatively small.

FIG. 9 is a table illustrating a coarse lock operation performed by a transmitter included in the communication system of FIG. 2. In the table of FIG. 9, a coarse-locked clock signal CLOCK_CL is shown. The course-locked clock signal CLOCK_CL is a clock signal on which a coarse lock operation is performed in the transmitter 1100 of FIG. 3. Also, a setting value of phase interpolation in the clock generator 1220 included in the receiver 1200 of FIG. 7 is shown.

Referring to FIG. 9, in a first row PCS1, a digital code corresponding to the coarse-locked clock signal CLOCK_CL is "1100" and a setting value of the phase interpolation is "P0-45." In a second row PCS2, a digital code corresponding to the coarse-locked clock signal CLOCK_CL is "0110" and a setting value of the phase interpolation is "P90-45." In a third row PCS3, a digital code corresponding to the coarse-locked clock signal CLOCK_CL is "0011" and a setting value of the phase interpolation is "P180-45." In a fourth row PCS4, a digital code corresponding to the coarse-locked clock signal CLOCK_CL is "1001" and a setting value of the phase interpolation is "P270-45." As illustrated in the table of FIG. 9, the setting value of the phase interpolation is set with a value calculated by subtracting 45 degrees from each phase clock because of a characteristic of an interpolator.

In the receiver 1200 of FIG. 7, if a bit lock detection signal BLD is not enabled, or if data and a clock signal are not synchronized, the digital code of the coarse-locked clock signal CLOCK_CL may be changed by the clock phase control circuit 1130 of FIG. 6 by being shifted in the order of "1100," "0110," "0011," and "1001." Once the bit lock detection signal BLD is enabled, the coarse-locked clock signal CLOCK_CL maintains one value of "1100," "0110," "0011," or "1001."

Referring again to FIG. 8, a digital code of the clock signal CLOCK corresponding to the bits D1, D2, D3 and D4 of the first data DATA is "1100," and a digital code of the coarse-locked clock signal CLOCK_CL corresponding to the bits D1, D2, D3 and D4 of the first data DATA is "1001." If the digital code of the coarse-locked clock signal CLOCK_CL is "1001," for example, the setting value of the phase interpolation in the clock generator 1220 included in the receiver 1200 of FIG. 7 is "P270-45."

Figure 10:
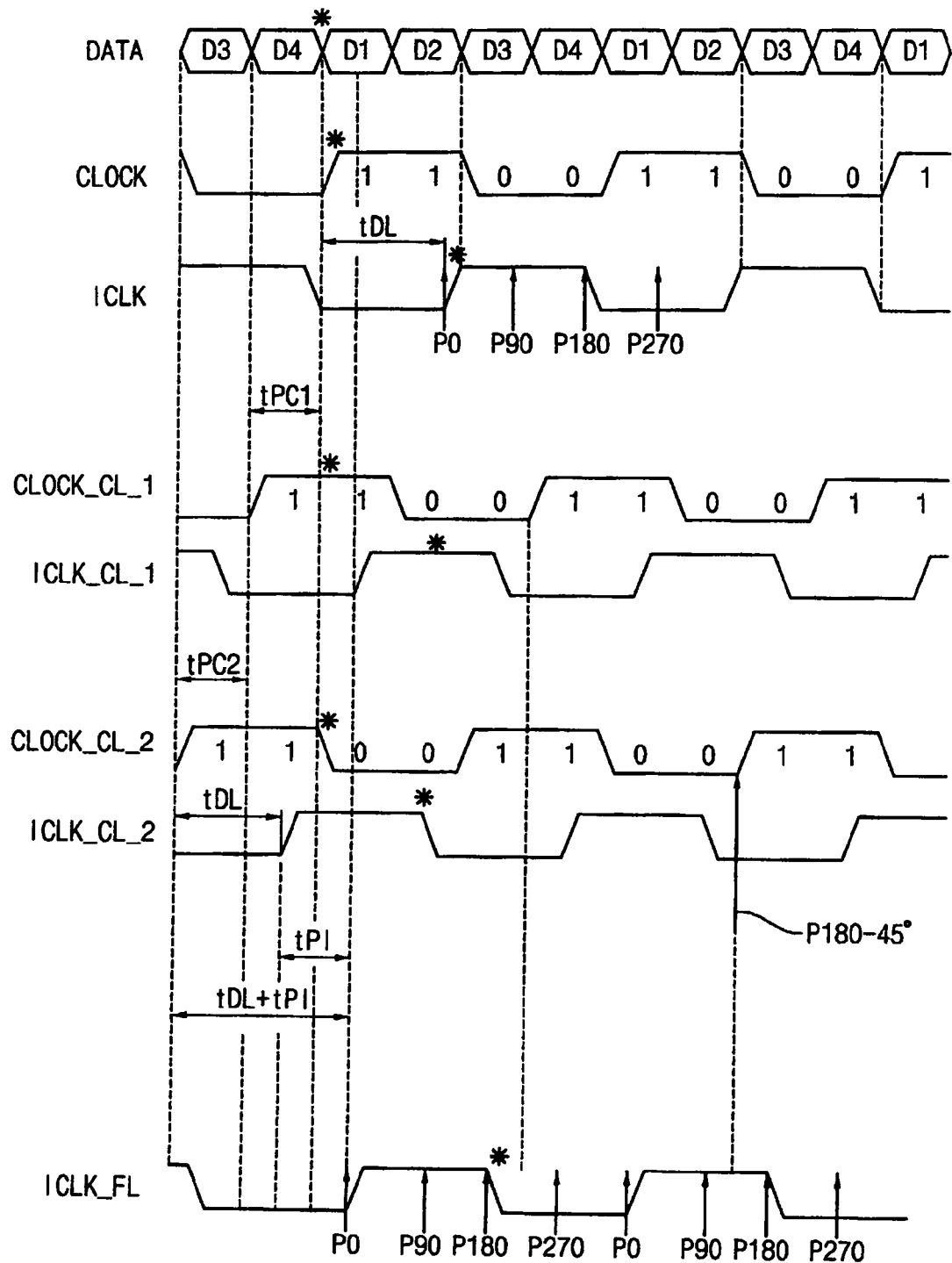
FIG. 10 is a timing diagram illustrating another process of synchronizing multi-phase clock signals with data in the communication system of FIG. 2.

FIG. 10 is a timing diagram illustrating another process of synchronizing multi-phase clock signals with data in the communication system of FIG. 2. In an example illustrated in FIG. 10, two coarse lock operations are performed.

Referring to FIG. 10, the transmitter 1100 illustrated in FIG. 2 transfers first data DATA and a clock signal CLOCK after the first data DATA and the clock signal CLOCK are synchronized. A noise of the first data DATA and a noise of the clock signal CLOCK may simultaneously occur. A noise of an internal clock signal ICLK, or the second multi-phase clock signals, generated in the receiver 1200, however, occurs when a first delay time tDL elapses after the noise of the first data DATA occurs.

A first coarse-locked clock signal CLOCK_CL_1 that is generated after a first coarse lock operation is performed in the transmitter 1100 may lead the clock signal CLOCK by a first phase control time tPC1. A noise of the first coarse-locked clock signal CLOCK_CL_1 may occur substantially simultaneously with the noise of the first data DATA. A noise of a first coarse-locked internal clock signal ICLK_CL_1, which is a clock signal that is delayed with respect to the first coarse-locked clock signal CLOCK_CL_1 by the delay line included in the receiver 1200, may occur when the first delay time tDL elapses after the noise of the first data DATA occurs.

If the first coarse lock operation is not sufficient to complete a coarse lock operation, a second coarse lock operation is performed. A second coarse-locked clock signal CLOCK_CL_2 that is generated after the second coarse lock operation is performed in the transmitter 1100 may lead the first coarse-locked clock signal CLOCK_CL_1 by a second phase control time tPC2. A noise of the second coarse-locked clock signal CLOCK_CL_2 may occur simultaneously with the noise of the first data DATA. A noise of a second coarse-locked internal clock signal ICLK_CL_2, which is a clock signal delayed with respect to the second coarse-locked clock signal CLOCK_CL_2 by the delay line included in the receiver 1200, may occur when the first delay time tDL elapses after the noise of the first data DATA occurs.

A fine-locked internal clock signal ICLK_FL, which is generated after a fine lock operation is performed on the second coarse-locked clock signal CLOCK_CL_2, is synchronized with the first data DATA. Thus, a rising edge of a first phase clock P0 of the fine-locked internal clock signal ICLK_FL may be aligned to the center of the first bit D1 of the first data DATA. In the timing diagram of FIG. 10, a delay time caused by the phase interpolation during the fine lock operation may be about 1 UI. In an example of FIG. 10, a time difference between when the noise of the first data DATA occurs and when a noise of the fine-locked internal clock signal ICLK_FL occurs is shorter than 3 UI.

As illustrated in FIG. 10, since a delay time caused by phase interpolation is relatively short in a receiver included in a communication system according to some example embodiments of the present invention, the size of a shift register included in a phase interpolator may be relatively small.

Figure 11:
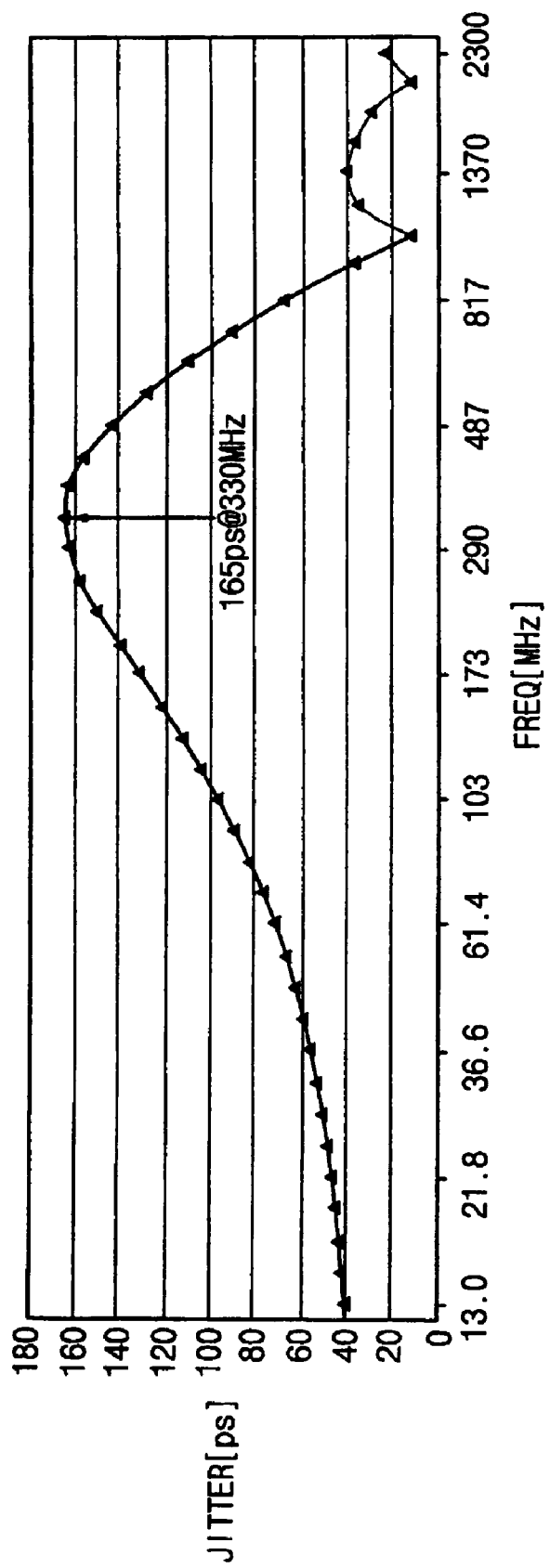
FIG. 11 is a graph illustrating a jitter noise in a conventional communication system.
Figure 12:
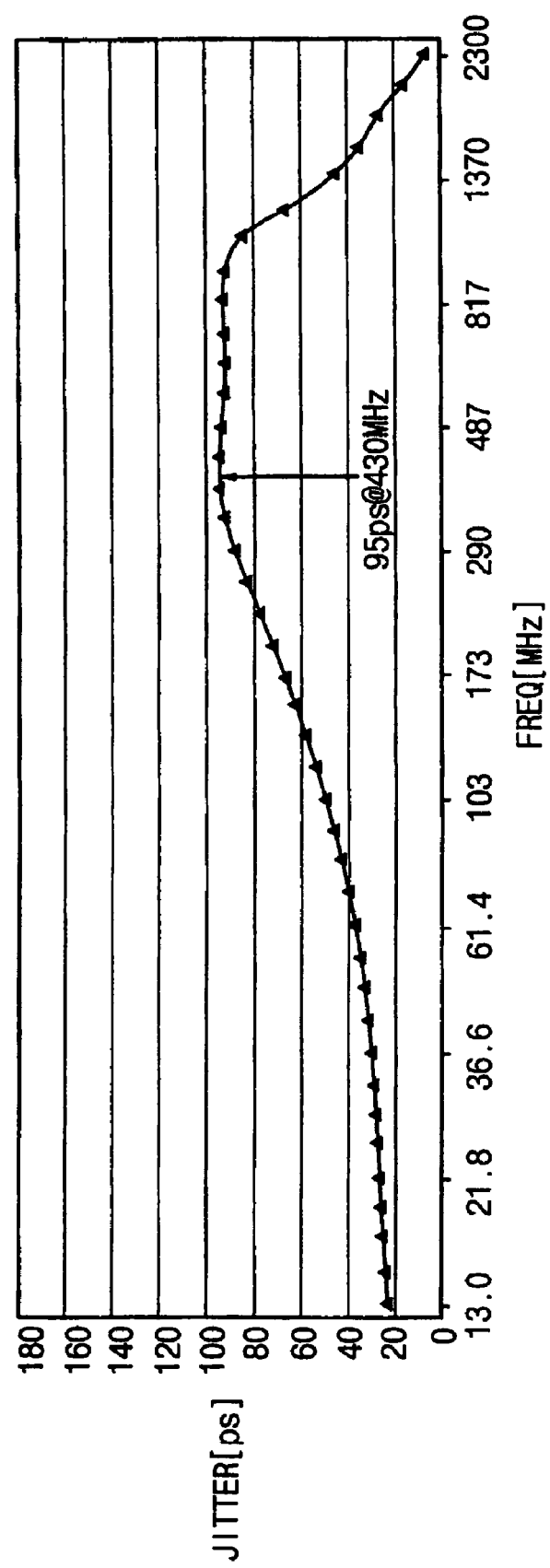
FIG. 12 is a graph illustrating a jitter noise in a communication system according to example embodiments of the present invention.

FIGS. 11 and 12 are graphs illustrating jitter noises in a conventional communication system and in a communication system according to example embodiments of the present invention, respectively. In FIG. 1, the jitter noise depending on an operating frequency of the conventional communication system synchronizing data and a clock signal in a conventional method is illustrated. In FIG. 12, the jitter noise depending on an operating frequency of the communication system of FIG. 2 according to some example embodiments of the present invention is illustrated.

Referring to FIGS. 11 and 12, a maximum value of the jitter noise at the frequency of 330 MHz is 165 picoseconds (ps) in the conventional communication system, and a maximum value of the jitter noise at the frequency of 430 MHz is 95 ps in the communication system according to some example embodiments of the present invention. As illustrated in examples of FIGS. 11 and 12, a jitter characteristic of the communication system according to example embodiments of the present invention is improved over that of the conventional communication system.

Figure 13:
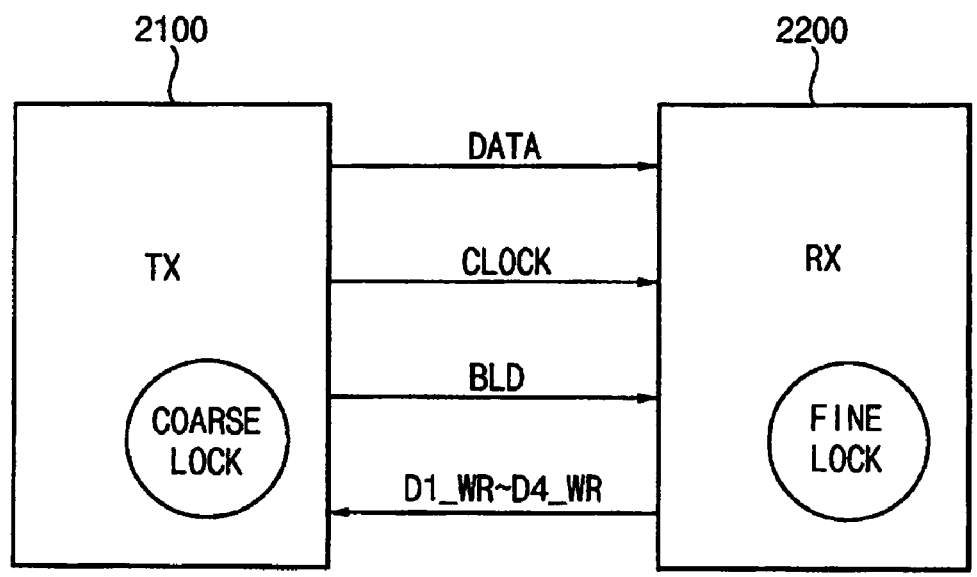
FIG. 13 is a block diagram illustrating a communication system according to another example embodiment of the present invention.

FIG. 13 is a block diagram illustrating a communication system according to another example embodiment of the present invention. Referring to FIG. 13, the communication system 2000 includes a transmitter 2100 and a receiver 2200. In the communication system 2000 of FIG. 13, the transmitter 2100 performs a coarse lock operation and the receiver 2200 performs a fine lock operation.

The transmitter 2100 generates first data DATA having a plurality of bits and first multi-phase clock signals, and output the first data DATA in response to the first multi-phase clock signals. The transmitter 2100 generates a bit lock detection signal BLD in response to second data having a plurality of bits D1_WR, D2_WR, D3_WR and D4_WR. The transmitter 2100 may also generate a clock signal CLOCK of which a phase changes in response to the bit lock detection signal BLD, and may output the clock signal CLOCK in response to the first multi-phase clock signals. In some embodiments, the transmitter 2100 may be included in a memory controller, the receiver 2200 may be included in a memory device, and the second data may be write data.

The receiver 2200 may perform a fine lock operation based on the bit lock detection signal BLD and the clock signal CLOCK, and may generate second multi-phase clock signals. The receiver 2200 may generate the second data by sampling the first data DATA in response to the internal clock signal.

Figure 14:
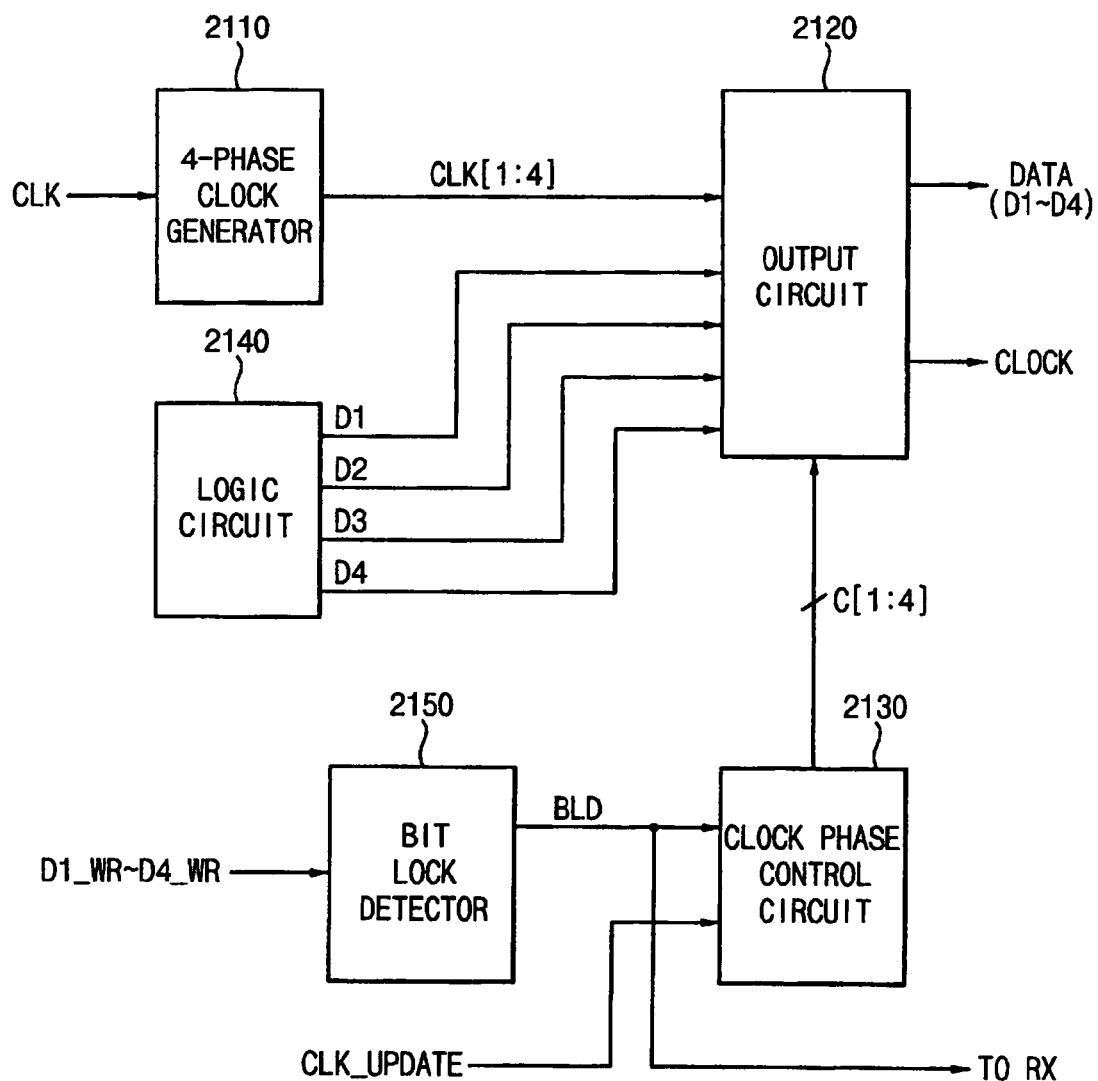
FIG. 14 is a block diagram illustrating an example of a transmitter included in the communication system of FIG. 13.

FIG. 14 is a block diagram illustrating an example of a transmitter included in the communication system of FIG. 13. Referring to FIG. 14, the transmitter 2100 may include a multi-phase clock generator 2110, a clock phase control circuit 2130, a logic circuit 2140, a bit lock detector 2150 and an output circuit 2120.

The multi-phase clock generator 2110 may generate the first multi-phase clock signals CLK[1:4], for example 4-phase clock signals, based on an external clock signal CLK. The bit lock detector 2150 receives the second data from the receiver 2200 and may detect whether the first data DATA are bit-locked in response to a first bit D1_WR of the second data, and generates the bit lock detection signal BLD according to a result of the determination. The clock phase control circuit 2130 may generate a clock phase control signal C[1:4] of 4 bits in response to the bit lock detection signal BLD and a clock update signal CLK_UPDATE. The logic circuit 2140 may generate the first data DATA of 4 bits D1, D2, D3, and D4. The output circuit 2120 may output the first data DATA in response to the first multi-phase clock signals CLK[1:4], and may generate the clock signal CLOCK based on the clock phase control signal C[1:4] and the first multi-phase clock signals CLK[1:4].

Figure 15:
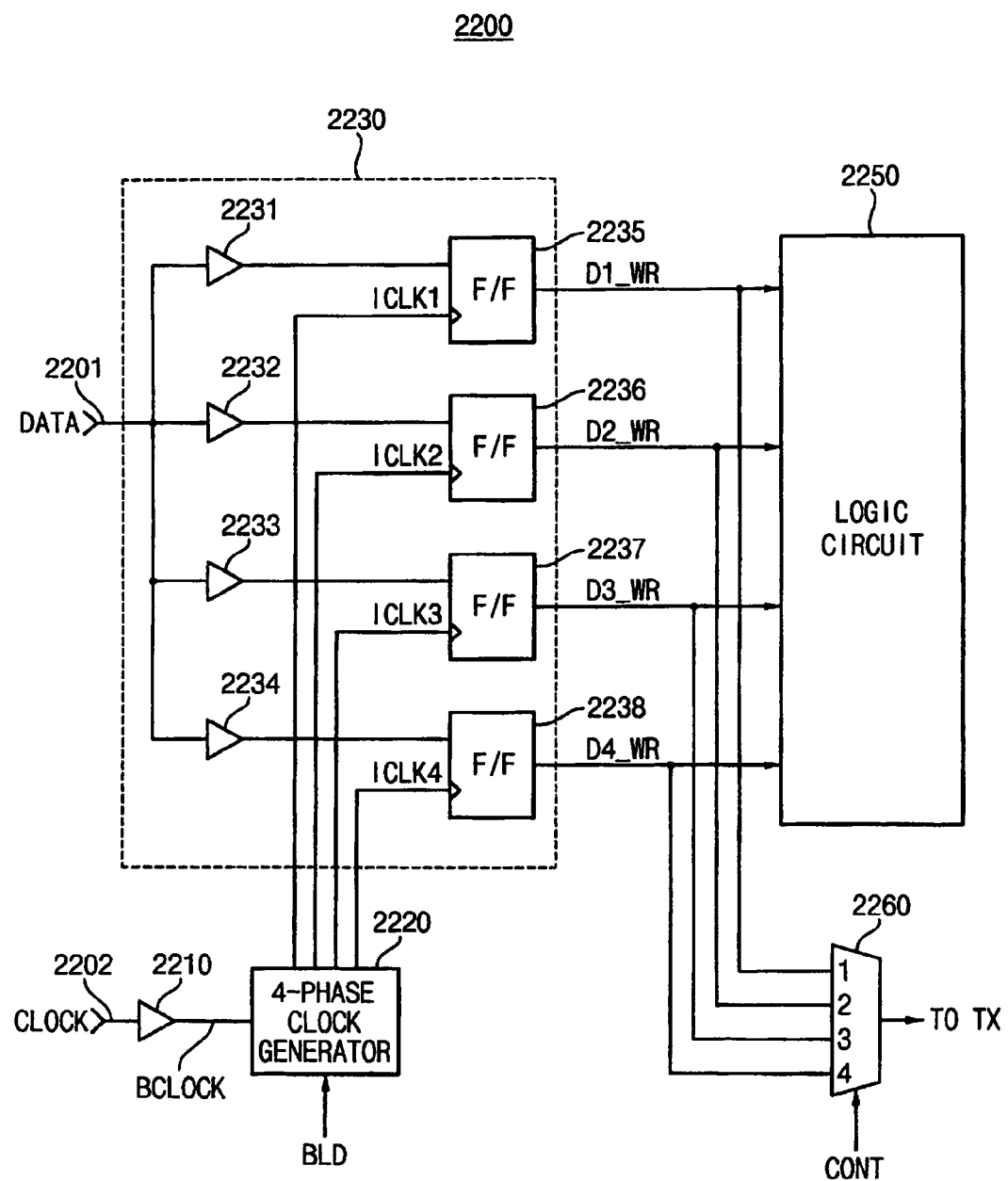
FIG. 15 is a block diagram illustrating an example of a receiver included in the communication system of FIG. 13.

FIG. 15 is a block diagram illustrating an example of a receiver included in the communication system of FIG. 13. Referring to FIG. 15, the receiver 2200 may include a first buffer 2210, a multi-phase clock generator 2220, an input circuit 2230, a multiplexer 2260 and a logic circuit 2250.

The receiver 2200 receives the first data DATA through a data input terminal 2201, and receives the clock signal CLOCK through a clock input terminal 2202. The first buffer 2210 buffers the clock signal CLOCK. The multi-phase clock generator 2220 may perform phase interpolation based on the bit lock detection signal BLD and an output signal BCLOCK of the first buffer 2210, and may generate the second multi-phase clock signals ICLK1, ICLK2, ICLK3 and ICLK4.

The input circuit 2230 may generate the second data by sampling the first data DATA in response to each phase clock signal ICLK1, ICLK2, ICLK3 and ICLK4 of the second multi-phase clock signals. The logic circuit 2250 operates in response to each bit D1_WR, D2_WR, D3_WR and D4_WR of the second data. The bit lock detection signal BLD in the receiver 2200 of FIG. 15 may be the bit lock detection signal BLD received from the transmitter 2100 illustrated in FIG. 13.

The input circuit 2230 may include a second buffer 2231, a third buffer 2232, a fourth buffer 2233, and a fifth buffer 2234, a first flip-flop 2235, a second flip-flop 2236, a third flip-flop 2237 and a fourth flip-flop 2238.

The second buffer 2231, the third buffer 2232, the fourth buffer 2233 and the fifth buffer 2234 are configured to buffer the first data DATA. The first flip-flop 2235 may output a first bit D1_WR of the second data by sampling an output signal of the second buffer 2231 in response to a first phase clock signal ICLK1 of the second multi-phase clock signals. The second flip-flop 2236 may output a second bit D2_WR of the second data by sampling an output signal of the third buffer 2232 in response to a second phase clock signal ICLK2 of the second multi-phase clock signals. The third flip-flop 2237 may output a third bit D3_WR of the second data by sampling an output signal of the fourth buffer 2233 in response to a third phase clock signal ICLK3 of the second multi-phase clock signals. The fourth flip-flop 2238 may output a fourth bit D4_WR of the second data by sampling an output signal of the fifth buffer 2234 in response to a fourth phase clock signal ICLK4 of the second multi-phase clock signals. Each bit D1_WR, D2_WR, D3_WR and D4_WR of the second data includes bit lock information. The receiver 2200 provides each bit D1_WR, D2_WR, D3_WR and D4_WR of the second data to the transmitter 2100 of FIG. 14 through the multiplexer 2260. The multiplexer 2260 selectively outputs the bits D1_WR, D2_WR, D3_WR and D4_WR of the second data in response to a selection control signal CONT.

Hereinafter, operations of the communication system 2000 according to some example embodiments of the present invention will be described with reference to FIGS. 13 through 15. In the communication system 2000 of FIG. 13, unlike in the communication system 1000 of FIG. 2, the bit lock detector 2150 is included in the transmitter 2100. The bit lock detector 2150 receives the first bit D1_WR of the second data from the transmitter 2200, detects whether the first data DATA are bit-locked in response to the first bit D1_WR of the second data, and generates the bit lock detection signal BLD. Each of the transmitter 2100 and the receiver 2200 may be implemented with one semiconductor integrated circuit.

Since the operations of the communication system 2000 of FIG. 13 are similar to those of the communication system 1000 of FIG. 2, detailed descriptions of the operations of the communication system 2000 of FIG. 13 are omitted.

As mentioned above, in order to synchronize a clock signal and data used in the receiver in the communication system according to some example embodiments of the present invention, the transmitter performs a coarse lock operation on the clock signal and the receiver performs a fine lock operation on the clock signal. Thus, in the receiver included in the communication system according to some example embodiments of the present invention, a jitter noise may be reduced and a delay time to be generated by a phase interpolator may be shorter than a delay time required by the conventional communication system. Therefore, in the communication system according to some example embodiments of the present invention, a circuit size of a multi-phase clock generator included in the receiver may be reduced and a chip size of the receiver may be reduced.

While the example embodiments of the present invention and their advantages have been described in detail, it should be understood that various changes, substitutions and alterations may be made herein without departing from the scope of the invention.

What is claimed is:

1. A communication system, comprising:
   a transmitter configured to output first data and a clock signal based on first multi-phase clock signals, and to perform a coarse lock operation on the clock signal responsive to a bit lock detection signal, the bit lock detection signal indicating whether or not the first data are bit-locked, the transmitter including,
      a multi-phase clock generator configured to generate the first multi-phase clock signals based on an external clock signal;
      a clock phase control circuit configured to generate a clock phase control signal having a plurality of bits responsive to the bit lock detection signal and a clock update signal; and
      an output circuit configured to output the first data responsive to the first multi-phase clock signals, and to output the clock signal responsive to the clock phase control signal and the first multi-phase clock signals, the output circuit including,
         a first multiplexer configured to sequentially output bits of the first data responsive to the first multi-phase clock signals; and
         a second multiplexer configured to sequentially output the bits of the clock phase control signal as the clock signal responsive to the first multi-phase clock signals; and
   a receiver configured to receive the first data and the clock signal from the transmitter, and to perform a fine lock operation responsive to the bit lock detection signal.

2. The communication system of claim 1, wherein the receiver is configured to generate second multi-phase clock signals based on the clock signal, to generate second data by sampling the first data based on the second multi-phase clock signals, and to perform the fine lock operation on the second multi-phase clock signals responsive to the bit lock detection signal.

3. The communication system of claim 1, wherein the transmitter is configured to perform the coarse lock operation until the first data are bit-locked so as to coarsely adjust a phase of the clock signal.

4. The communication system of claim 2, wherein the receiver is configured to perform the fine lock operation using phase interpolation after the first data are bit-locked so as to finely adjust phases of the second multi-phase clock signals.

5. The communication system of claim 2, wherein the receiver is configured to generate the bit lock detection signal based on the second data, and to transmit the bit lock detection signal to the transmitter.

6. The communication system of claim 1, wherein the transmitter further comprises:
   a logic circuit configured to generate bits of the first data.

7. The communication system of claim 1, wherein the clock phase control circuit comprises:
   a first logic circuit configured to generate a shift enable signal having one or more pulses responsive to the bit lock detection signal and the clock update signal when the bit lock detection signal is disabled; and a shift register configured to perform a shift operation responsive to the shift enable signal, and to output the bits of the clock phase control signal.

8. The communication system of claim 2, wherein the receiver comprises:

a multi-phase clock generator configured to generate the second multi-phase clock signals by performing phase interpolation on the clock signal responsive to the bit lock detection signal;

an input circuit configured to generate the second data by sampling the first data responsive to the second multi-phase clock signals; and a bit lock detector configured to generate the bit lock detection signal by detecting whether the first data are bit-locked based on the second data.

9. The communication system of claim 8, wherein the receiver further comprises a logic circuit configured to receive the second data.

10. A system, comprising:

a transmitter configured to output first data and a clock signal based on first multi-phase clock signals, and to perform a coarse lock operation on the clock signal responsive to a bit lock detection signal, the bit lock detection signal indicating whether or not the first data are bit-locked, the transmitter including, a multi-phase clock generator configured to generate the first multi-phase clock signals based on an external clock signal;

a logic circuit configured to generate bits of the first data;

a bit lock detector configured to generate the bit lock detection signal by detecting whether the first data are bit-locked based on the second data;

a clock phase control circuit configured to generate a clock phase control signal having a plurality of bits responsive to the bit lock detection signal and a clock update signal; and an output circuit configured to output the first data responsive to the first multi-phase clock signals, and to output the clock signal responsive to the clock phase control signal and the first multi-phase clock signals; and a receiver configured to receive the first data and the clock signal from the transmitter, and to perform a fine lock operation responsive to the bit lock detection, wherein the receiver is configured to generate second data based on second multi-phase clock signals and to transmit the second data to the transmitter, and wherein the transmitter is configured to generate the bit lock detection signal based on the second data.

11. The system of claim 10, wherein the receiver is configured to generate the second data by sampling the first data based on the second multi-phase clock signals.

12. The system of claim 10, wherein the output circuit comprises:

a first multiplexer configured to sequentially output bits of the first data responsive to the first multi-phase clock signals; and a second multiplexer configured to sequentially output the bits of the clock phase control signal as the clock signal responsive to the first multi-phase clock signals.

13. The system of claim 10, wherein the clock phase control circuit comprises:

a first logic circuit configured to generate a shift enable signal having one or more pulses responsive to the bit lock detection signal and the clock update signal when the bit lock detection signal is disabled; and a shift register configured to perform a shift operation responsive to the shift enable signal, and to output the bits of the clock phase control signal.

14. The system of claim 10, wherein the receiver comprises:

a multi-phase clock generator configured to generate the second multi-phase clock signals by performing phase interpolation based on the bit lock detection signal and the clock signal; and an input circuit configured to generate the second data by sampling the first data responsive to the second multi-phase internal clock signals.

15. The system of claim 14, wherein the receiver further comprises a multiplexer configured to selectively output each bit of the second data responsive to a selection control signal.

16. The system of claim 15, wherein the multiplexer is configured to transfer at least one bit of the second data to the transmitter.

17. A system, comprising:

a transmitter configured to output first data and a clock signal based on first multi-phase clock signals, and to perform a coarse lock operation on the clock signal responsive to a bit lock detection signal, the bit lock detection signal indicating whether or not the first data are bit-locked; and a receiver configured to receive the first data and the clock signal from the transmitter, and to perform a fine lock operation responsive to the bit lock detection signal, wherein the receiver is configured to generate second data by sampling the first data based on second multi-phase clock signals, wherein the transmitter comprises:

a multi-phase clock generator configured to generate the first multi-phase clock signals based on an external clock signal;

a bit lock detector configured to generate the bit lock detection signal by detecting whether the first data are bit-locked based on the second data;

a clock phase control circuit configured to generate a clock phase control signal having a plurality of bits responsive to the bit lock detection signal and a clock update signal; and an output circuit configured to output the first data responsive to the first multi-phase clock signals, and to output the clock signal responsive to the clock phase control signal and the first multi-phase clock signals, wherein the bit lock detector is electrically coupled to the clock phase control circuit and configured to transmit the bit lock detection signal to (a) the clock phase control circuit and (b) the receiver.

* * * * *